United States Patent [19]
Isogai

[11] Patent Number: 6,000,900
[45] Date of Patent: *Dec. 14, 1999

[54] WAFER CASSETTE CONVEYING SYSTEM

[75] Inventor: Teruo Isogai, Tateyama, Japan

[73] Assignee: Nippon Steel Semiconductor Corporation, Tateyama, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/791,666

[22] Filed: Jan. 30, 1997

[30] Foreign Application Priority Data

Apr. 30, 1996 [JP] Japan ..................... 8-109638

[51] Int. Cl.⁶ ....................................... B65H 5/00
[52] U.S. Cl. ..................... 414/222.02; 414/940
[58] Field of Search .................. 414/940, 937, 414/416, 331, 225, 222, 935, 222.01, 222.02, 331.01

[56] References Cited

U.S. PATENT DOCUMENTS 4,566,837  1/1986  Shiomi et al. .................... 414/222
5,527,390  6/1996  Ono et al. ...................... 414/940 X

FOREIGN PATENT DOCUMENTS 2-39450   2/1990   Japan .
3-288460  12/1991  Japan .
7-283093  10/1995  Japan .

*Primary Examiner*—Donald W. Underwood
*Attorney, Agent, or Firm*—Holland & Hart LLP

[57] ABSTRACT

A wafer cassette conveying system is capable of reducing a communication amount between a conveying device and a control device, further shortening the time period required for a movement of the conveying device. A control device 15, when receiving both of a lot carrying-in request signal outputted from a first treating device 11 and an empty cassette carrying-out request signal outputted from a second treating device 12, outputs a lot carrying-in command signal. A conveying device 20, when receiving this lot carrying-in command signal, conveys an actual cassette of the first treating device 11 to the second treating device 12 and also conveys an empty cassette of the second treating device 12 to an empty cassette space 14.

4 Claims, 6 Drawing Sheets

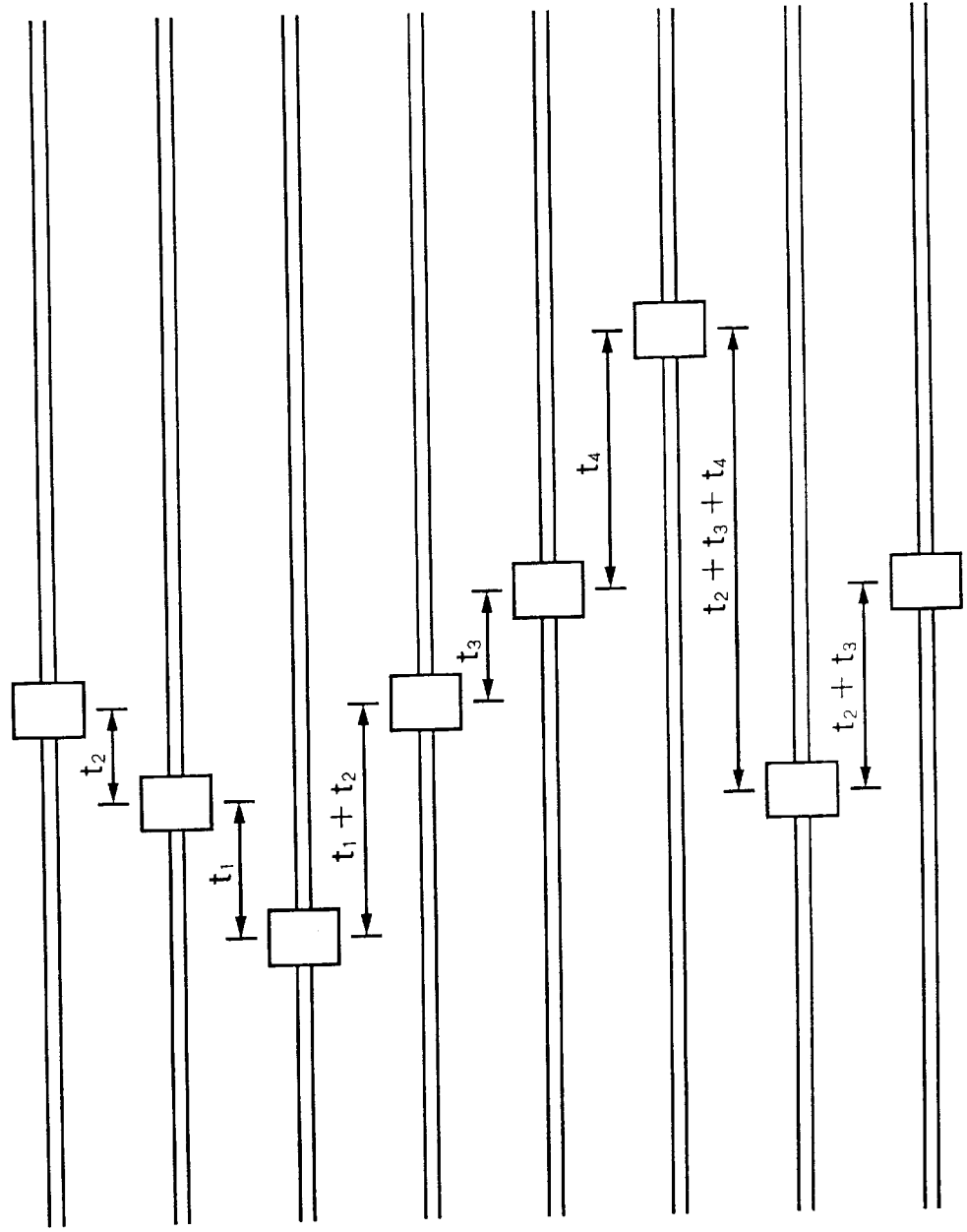

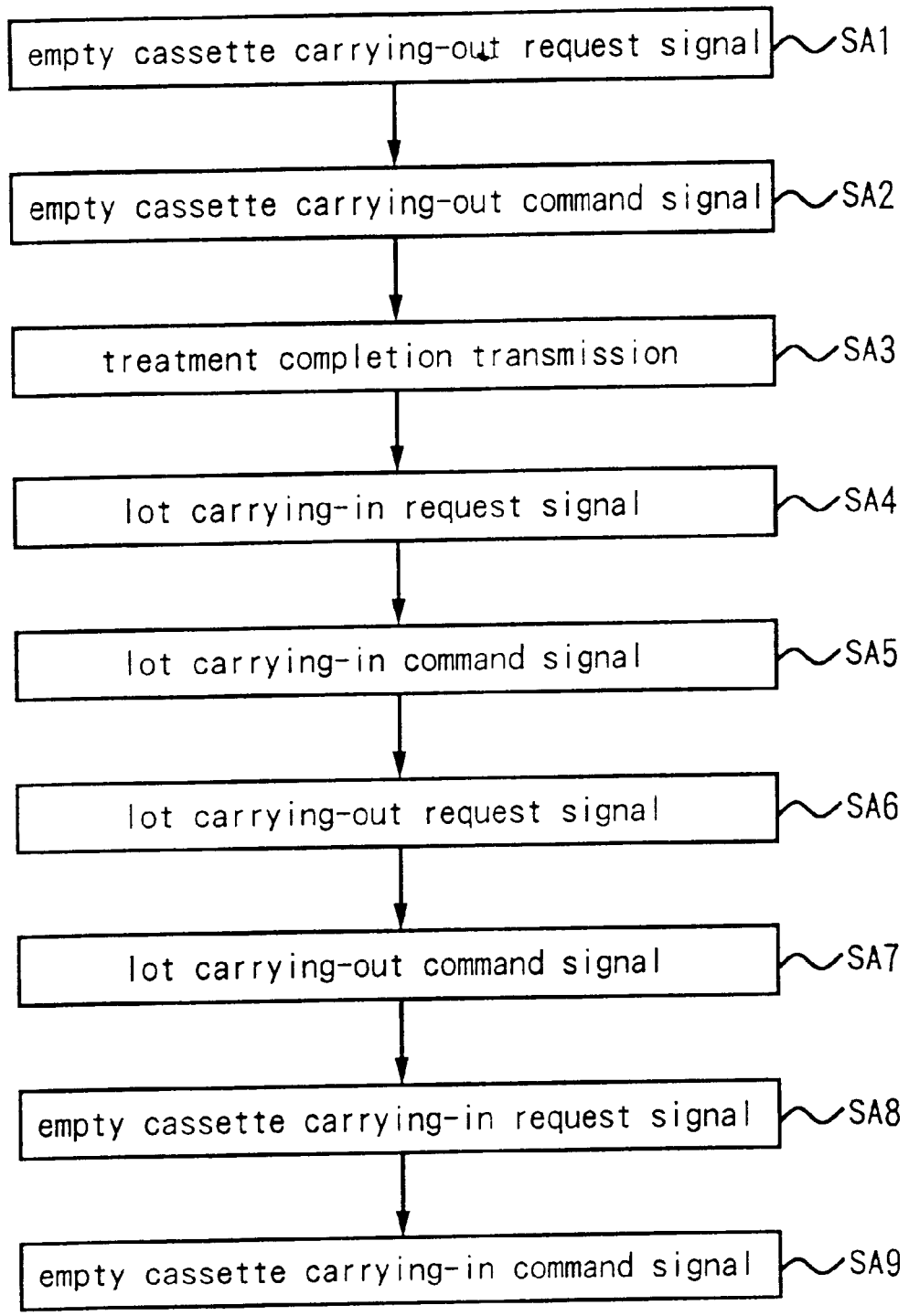

WAFER CASSETTE CONVEYING SYSTEM

BACKGROUND OF THE INVENTION

1. Field of the Invention

The present invention relates to a wafer cassette conveying system in a semiconductor producing apparatus.

2. Description of the Relevant Art

Conventionally, there is disclosed in the official gazette of Japanese Patent Application Laid Open (Kokai) 2-39450, a wafer cassette conveying system comprising trays on which are temporarily placed wafers, disposed respectively on a carrying-in port and a carrying-out port of a treating room disposed in a sheet treating device, thereby improving an efficiency of conveying the wafer cassette to the sheet treating device. FIG. 4 is a schematic configuration view of the wafer cassette conveying system in the sheet treating device which is provided with one treating room. In FIG. 4, reference numeral 1 designates the sheet treating device which is provided with a first wafer cassette space 2a, a first tray 3a, a treating room 4, a second tray 3b, and a second wafer cassette space 2b in the order named. Untreated wafers and treated wafers are placed temporarily on the first tray 3a and the second tray 3b mentioned above. Hereinafter, the wafer cassette which stores the wafers and the wafer cassette which does not store the wafers are referred to as "the actual cassette" and "the empty cassette", respectively.

In the above-described construction, the actual cassettes (two actual cassettes in FIG. 4), which store untreated wafers, are carried therein, then conveyed to the first cassette space 2a. The untreated wafers stored in one of the actual cassettes are transferred to the treating room 4 to be treated thereat, and then transferred to the second tray 3b in order. During this treatment, the other untreated wafers are transferred to the first tray 3a from the other of the actual cassettes placed on the first cassette space 2a. The above-mentioned two of the actual cassettes, from which the untreated wafers stored therein are taken out, become the empty cassettes. These two of the empty cassettes are transferred to the second wafer cassette space 2b. The treated wafers placed on the second tray 3b are stored in one of the empty cassettes. The untreated wafers placed on the first tray 3a are loaded into the treating room 4 to be treated thereat, then stored in the other of the empty cassettes through the second tray 3b.

As mentioned above, the description is made to a wafer cassette conveying system comprising trays on which are temporarily placed wafers, disposed respectively on a carrying-in port and a carrying-out port of a treating room disposed in a sheet treating device, thereby improving an efficiency of conveying the wafer cassette to the sheet treating device. There will be described hereinbelow a wafer cassette conveying system having a plurality of treating rooms. FIG. 5 is a configuration view of a conventional wafer cassette conveying system having a plurality of treating rooms. In FIG. 5, reference numerals 11, 12 and 13 designate a first treating device, a second treating device and a third treating device, respectively.

The first treating device 11 has a carrying-in cassette space 11a on which are temporarily placed a wafer cassette to be carried therein and a carrying-out cassette space 11b on which are temporarily placed an actual cassette storing the treated wafers therein. The first treating device 11 is comprised of, for example, a stocker, an inspection receiving stand, a cleaning device and an etching device and so on. Also, the first treating device 11 outputs a lot carrying-out request signal, indicative of carrying the wafer cassette into the second treating device 12 when the actual cassette storing the treated wafers is placed on the carrying-out cassette space 11b.

The second treating device 12 is provided with a plurality of treating portions 12-1 to 12-3. There are carried out at these treating portions 12-1 to 12-3, for example, a first cleaning treatment, a drying treatment, a second cleaning treatment and the like. Also, there are arranged at the second treating device 12 a carrying-in cassette space 12a on which are temporarily placed the carried-in wafer cassette and a carrying-out cassette space 12b temporarily placed the empty cassette which has stored the wafers having completed the respective treatments at the treating portions 12-1 to 12-3. At the second treating device 12, the wafers are transferred from the actual cassette placed on the carrying-in cassette space 12a to the respective treating portions 12-1 to 12-3 to thereby be treated thereat. Therefore, after all the wafers has been transferred, the above-mentioned actual cassette becomes empty. Also, when the treatment of the treating portion 12-3 is being carried out, the empty cassette must be placed on the carrying-out cassette space 12b previously, in order to store therein the wafers having completed the treatment at the treating portion 12-3.

Further, the second treating device 12 outputs an empty cassette carrying-out request signal indicative of carrying-out the empty cassette, when the actual cassette placed on the carrying-in cassette space 12a from which all the wafers have been transferred becomes the empty cassette, and also outputs a cassette carrying-in request signal indicative of carrying the empty cassette into the carrying-out cassette space 12b, when the actual cassette on the carrying-out cassette space 12b are carried out. Besides, the second treating device 12 outputs a lot carrying-out request signal, when the empty cassette placed on the carrying-out cassette space 12b becomes the actual cassette to which have been stored the wafers having completed the treatment at the treating portion 12-3.

Reference numeral 14 designates a cassette space arranged in the vicinity of the second treating device 12, on which the empty cassette is temporarily placed, when the actual cassette placed on the carrying-in cassette space 12a in the second treating device 12, from which all the wafers have been loaded to the treating portion 12-1, becomes the empty cassette. The empty cassette space 14 is provided with an empty cassette stand 14a on which can be placed several units of one or two cassettes, and on which can be delivered an empty cassette between operations by a conveying device 16 which will be described later.

Reference numeral 13 designates the third treating device such as, for example, a stocker, an inspection stand, a cleaning device, an etching device and the like. The third treating device 13 is provided with a carrying-in cassette space 13a on which the carried-in cassette is temporarily placed and a carrying-out cassette space 13b on which the cassette having completed treatment is temporarily placed. Further, the respective time periods required for the treatment in the first treating device 11, the second treating device 12, and the third treating device 13 are different from one another.

Reference numeral 15 designates a control device 15, being comprised of a CPU (Central Processing Unit), a RAM (Random Access Memory), a ROM (Read Only Memory) and the like, which controls the conveying device 16 based on a program stored in the ROM, the lot carrying-out request signal outputted from the first treating device 11, and the empty cassette carrying-out request signal, the lot carrying-in request signal, the empty cassette carrying-in request signal and the lot carrying-out request signal outputted from the second treating device 12. The conveying device 16 is provided with an arm for seizing the wafer cassette, and moves along a rail 17 to convey the wafer cassette. It takes a moving time period t1 for the conveying device 16 to move between the carrying-out cassette space 11b in the first treating device 11 and the empty cassette stand 14a on the cassette space 14, a moving time period $t_2$ between the empty cassette stand 14a on the cassette space 14 and the carrying-in cassette space 12a in the second treating device 12, a moving time period $t_3$ between the carrying-in cassette space 12a in the second treating device 12 and the carrying-out cassette space 12b in the second treating device 12, and a moving time period $t_4$ between the carrying-out cassette space 12b in the second treating device 12 and the carrying-in cassette space 13a in the third treating device 13.

An operation of the wafer cassette conveying system having the above-described construction will now be described with reference to FIG. 6 and FIG. 7. FIG. 6 is an explanatory view for an operation of the conveying device 16 according to the conventional wafer cassette conveying system, FIG. 7 is a flowchart showing a communicating condition between the control device 15 and the conveying device 16. Firstly, in an initial state, it is assumed that all of the first treating device 11, the second treating device 12, and the third treating device 13 perform treatments of the wafer, respectively, the actual cassettes are placed on the carrying-in cassette space 11a, 12a and 13a in the respective treating devices, and that the empty cassettes are placed on the carrying-out cassette space 11b, 12b and 13b in the same. Further, it is also assumed that the conveying device 16 is on standby at a location of the carrying-in cassette space 12a in the second treating device 12.

In the second treating device 12, when all the wafers are loaded to the treating portion 12-1 from the actual cassette placed on the carrying-in cassette space 12a, the second treating device 12 outputs the empty cassette carrying-out request signal to the control device 15 (step SA1). The control device 15, when receiving this empty cassette carrying-out request signal, outputs an empty cassette conveying command signal to the conveying device 16 (step SA2). The conveying device 16, when receiving this empty cassette conveying command signal, moves at a location of the empty cassette stand 14a while seizing the empty cassette placed on the carrying-in cassette space 12a and then places the empty cassette seized by itself on the empty cassette stand 14a, during which movement is required a time period $t_2$. The conveying device 16, when having completed this treatment, outputs a treatment completion signal to the control device 15 (step SA3). After this process, the conveying device 16 is on standby until the next command signal is outputted from the control device 15. The second treating device 12 outputs the lot carrying-in request signal to the control device 15, when the empty cassette is carried-out from the carrying-in cassette space 12a (step SA4).

Next, when the first treating device 11 has completed the treatment, then the empty cassette placed on the carrying-out cassette space 11b becomes the actual cassette to which have been stored the treated wafers, the first treating device 11 outputs the lot carrying-out request signal. The control device 15, when receiving this lot carrying-out request signal, outputs a lot carrying-in command signal to the conveying device 16 (step SA5). The conveying device 16, when receiving the lot carrying-in command signal, moves from a location of the empty cassette stand 14a to a location of the carrying-out cassette space 11b in the first treating device 11, during which movement is required a time period $t_1$. The conveying device 16, while seizing the actual cassette placed on the carrying-out cassette space 11b, moves to the carrying-in cassette space 12a in the second treating device 12, during which movement is required a time period $t_1+t_2$. The conveying device 16 places the actual cassette seized by itself on the carrying-in cassette space 12a in the second treating device 12. The conveying device 16, after having completed this treatment, is on standby at space 12b until the next command signal is outputted from the control device 15. The movement from space 12a to space 12b is time period $t_3$.

In the second treating device 12, the wafers stored in the actual cassette placed on the carrying-in cassette space 12a are loaded to the treating portion 12-1, and the last wafers, which have been loaded from the actual cassette placed on the carrying-in cassette space 12a to the treating portion 12-1 and treated in the treating portions 12-2 and 12-3, are stored in the empty cassette placed on the carrying-out cassette space 12b. The second treating device 12 outputs a lot carrying-out request signal, when all these wafers are stored in the empty cassette (step SA6). The control device 15, when receiving the lot carrying-out request signal, outputs the lot carrying-out command signal to the conveying device 16 (step SA7), then the conveying device 16, while seizing the actual cassette placed on the carrying-out cassette space 12b, moves to a location of the carrying-in cassette space 13a in the third treating device 13, during which movement is required a time period $t_4$. The conveying device 16, when having completed the movement, places the actual cassette seized by itself on the carrying-in cassette space 13a. The second treating device 12, after having completed the treatment, outputs the empty cassette carrying-in request signal (step SA8).

The control device 15, when receiving the above empty cassette carrying-in request signal, outputs an empty cassette carrying-in command signal to the conveying device 16 (step SA9). The conveying device 16, when receiving this empty cassette carrying-in command signal, moves to a location of the empty cassette stand 14a, during which movement is required a time period $t_2+t_3+t_4$. The conveying device 16, while seizing the empty cassette placed on the empty cassette stand 14a, moves to a location of the carrying-out cassette space 12b in the second treating device 12 and places the empty cassette seized by itself thereon. The conveying device 16, after having completed this treatment, moves to a location of the carrying-in cassette space 12a in the second treating device 12, whereby the operation of the one cycle has been completed.

In the operation of the one cycle mentioned above, the control device 15 outputs four time-commands to the conveying device 16, so that the time period required for the movement of the conveying device 16 is calculated by the use of the following equation:

$$t_2+t_1+(t_1+t_2)+t_3+t_4+(t_2+t_3+t_4)+t_2+t_3=2t_1+4t_2+3t_3+2t_4.$$

As described above, according to the conventional wafer cassette conveying system, the conveying device 16 conveys the empty cassette or the actual cassette while seizing the same. When the conveying device 16 carries in and carries out the empty cassette to the second treating device 12, the second treating device 12 outputs the empty cassette carrying-in request signal and the empty cassette carrying-out request signal, respectively, and then the control device 15 outputs the empty cassette carrying-in command signal and the empty cassette carrying-out command signal to the conveying device 16. After receiving these signals, the conveying device 16, when conveying the empty cassette to the second treating device 12, has to move to a location of the empty cassette stand 14a, seize the empty cassette and carry-in the same into the second treating device 12, also, when carrying-out the empty cassette from the second treating device 12, has to convey the empty cassette in the second treating device 12 to a location of the empty cassette stand 14a. Therefore, there are problems that the communications between the control device 15 and the conveying device 16 are generated too frequently, and that the time period required for the movement of the conveying device 16 is made long.

Also, there is disclosed in the official gazette of Japanese Patent Application Laid Open (Kokai) No. 7-283093 a technique which improves the conveying efficiency. In the technique described in the above gazette, there is no empty cassette between respective treating devices, a plurality of treating devices are concentrated and conveying passages for exclusive use of carrying vehicles are disposed between the respective treating devices. In this technique, the wafer cassette travels depending on the condition of the treatments in the respective treating devices. Also, there are problems in this technique that the conveying passages for exclusive use, a conveying/moving mechanism and a conveying passage controlling mechanism are required, so the system is increased in cost and the respective treating devices cannot be used unless they are not suitable for the above conveying passage controlling mechanism, compared with the above-mentioned case where the empty cassette space is provided.

SUMMARY OF THE INVENTION

The present invention has been made in view of the above-mentioned circumstances, it is an object of the present invention to provide a wafer cassette conveying system which is capable of reducing the frequencies of the communication between the conveying device and the control device without increasing the cost of the whole system, and further of shortening the time period required for the movement of the conveying device.

In order to resolve the above-mentioned problems, the present invention according to claim 1 is characterized by comprising at least two treating devices for introducing a wafer from a wafer cassette to treat the same, outputting an introduction completion signal when the wafer has completed the introduction, and outputting a treatment completion signal when the wafer has completed the treatment, a control device for outputting a conveying command signal, when two of the treating devices which are different from each other output the treatment completion signal and the introduction completion signal, respectively, and a conveying device for conveying the wafer cassette from the treating device which has outputted the treatment completion signal to the treating device which has outputted the introduction completion signal based on the conveying command signal.

The present invention according to claim 2 is characterized in that the system further comprises an empty cassette space on which an empty cassette are placed, arranged independently to the treating device, the conveying device, after the wafer cassette has been conveyed from the treating device which has outputted the treatment completion signal to the treating device which has outputted the introduction completion signal, conveying the empty cassette from the treating device which has outputted the introduction completion signal to the empty cassette space.

According to the present invention, since the communication is not carried out corresponding to the treatment of the empty cassette, there are effects that the communication amount is reduced to a half of the one in the prior art, the control device and the conveying device are reduced in load, and scheduling is performed efficiently. Furthermore, since the conveying device does not move only corresponding to the treatment of the empty cassette, there is an effect that the time period required for the movement of the conveying device is reduced to two-thirds, and which results improvement of the conveying efficient.

Further object and advantages of the present invention will be apparent from the following description of the preferred embodiment of the present invention as illustrated in the appended drawings.

BRIEF DESCRIPTION OF THE DRAWINGS

FIG. 6 is a explanatory view of an operation of a conveying device 16 according to the conventional wafer cassette conveying system;

FIG. 7 is a view of showing a communicating condition between the control device 15 and the conveying device 16.

DETAILED DESCRIPTION OF THE PREFERRED EMBODIMENTS

Figure 1:
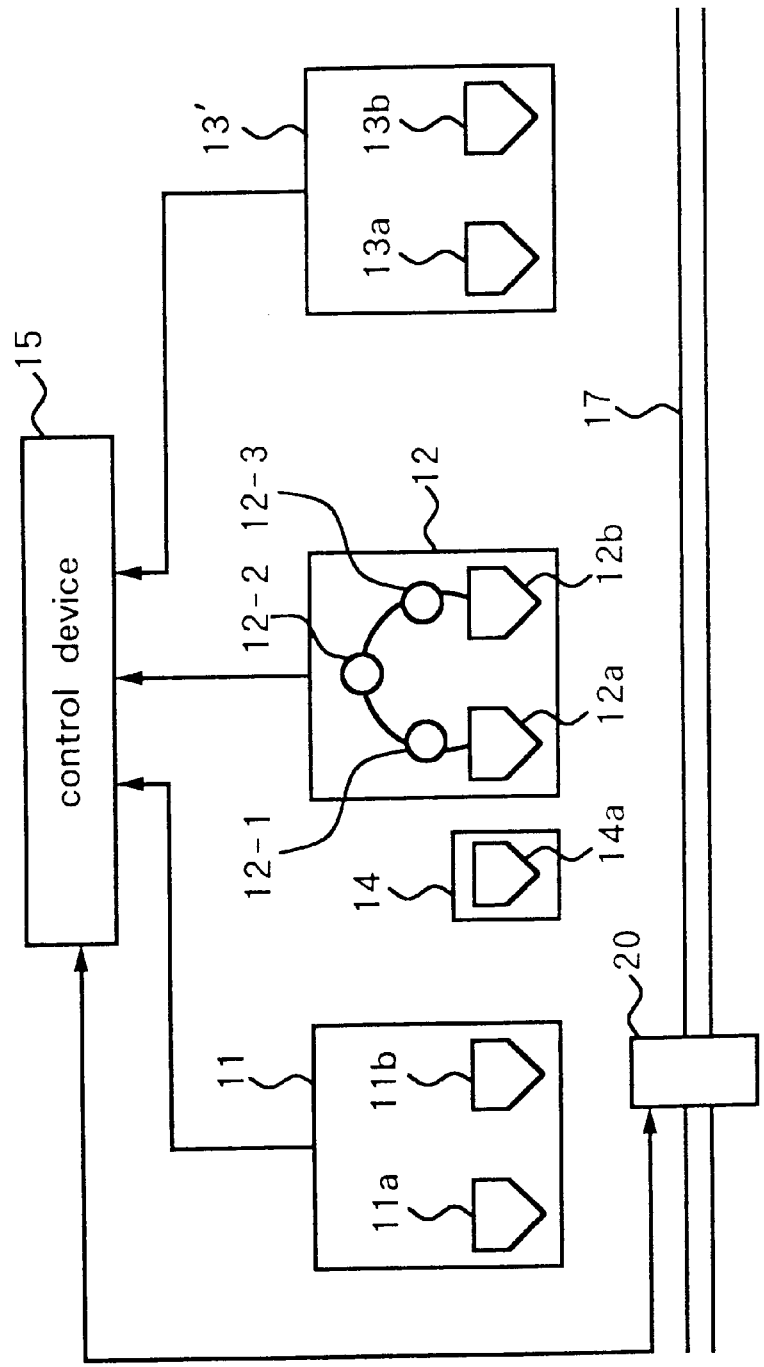
FIG. 1 is a configuration view of a wafer cassette conveying system according to an embodiment of the present invention.
Figure 5:
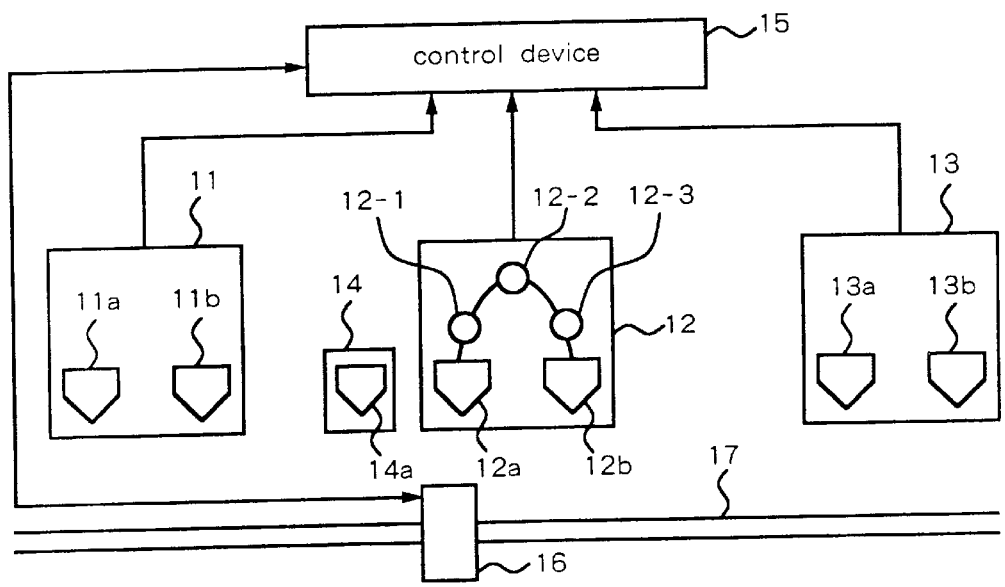
FIG. 5 is a configuration view of a conventional wafer cassette conveying system having a plurality of treating rooms.

A wafer cassette conveying system according to an embodiment of the invention will be described hereinafter with reference to the drawings. FIG. 1 is a view showing a construction of the wafer cassette conveying system according to the embodiment of the invention. In FIG. 1, elements and parts corresponding to those in FIG. 5 are designated by identical reference numerals, description of which is, therefore, omitted. In FIG. 1, reference numeral 13' designates the same device as the third treating device 13 in FIG. 5, which outputs an empty cassette carrying-out request signal when an actual cassette placed on a carrying-in cassette space 13a becomes an empty cassette. Also, reference numeral 20 designates a conveying device which is capable of, when seizing a wafer cassette, seizing the wafer cassette placed on a carrying-in cassette space 12a of the second treating device 12 and the carrying-in cassette space 13a of the second treating device 13', and placing the wafer cassette seized by itself thereon. That is, it can exchange the wafer cassette seized by itself for the wafer cassette being placed.

Figure 2:
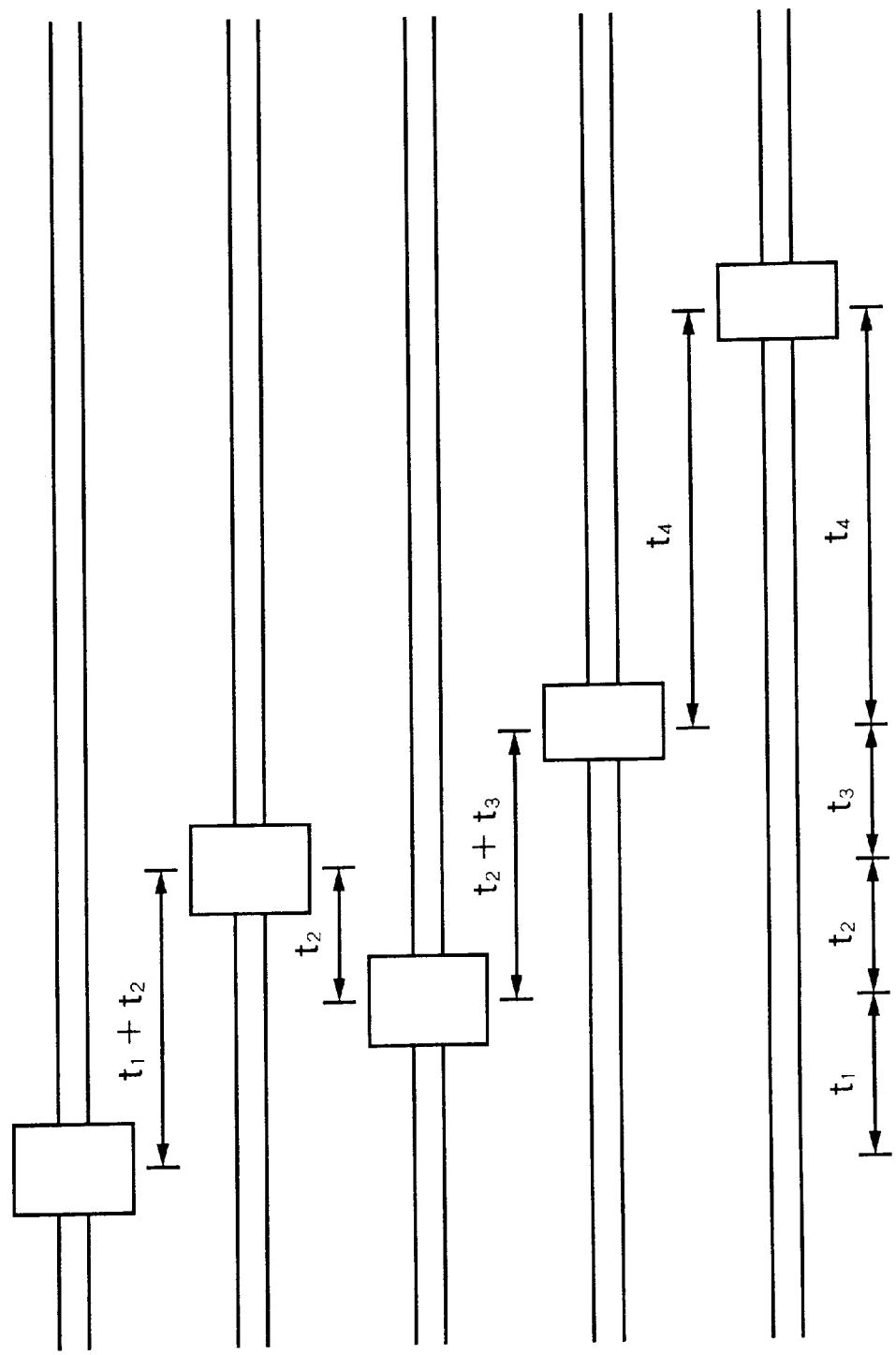
FIG. 2 is an explanatory view of an operation of a conveying device 20 of the wafer cassette conveying system according to the embodiment of the present invention.
Figure 3:
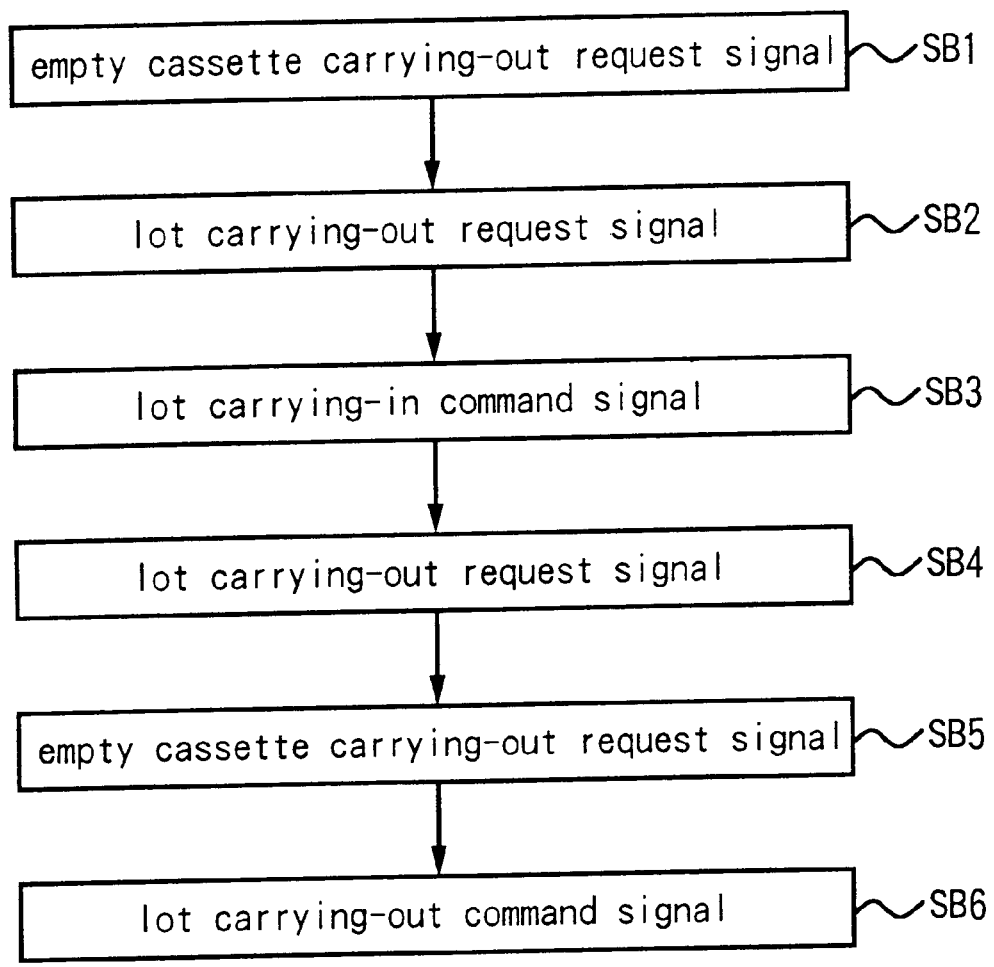
FIG. 3 is a view of showing a communicating condition between a control device 15 and the conveying device 20 according to the embodiment of the present invention.
Figure 4:
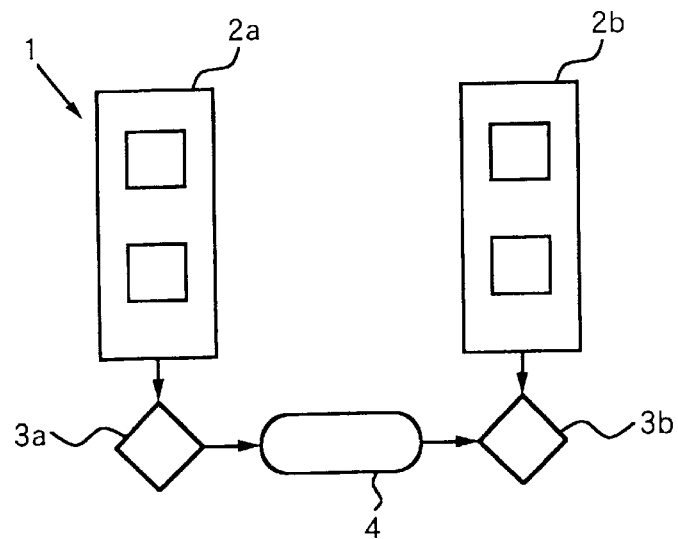
FIG. 4 is a schematic configuration view of the wafer cassette conveying system in a sheet treating device which is provided with one treating room.

Next, an operation of the wafer cassette conveying system according to the embodiment of the present invention will be explained with reference to FIG. 2 and FIG. 3. FIG. 2 is an explanatory view of the operation of the conveying device 20 of the wafer cassette conveying system according to the embodiment of the present invention, and FIG. 3 is a view of showing a communicating condition between a control device 15 and the conveying device 20 according to the embodiment of the present invention. At first, in an initial state, any one of the first treating device 11, the second treating device 12 and the third treating device 13' treats a wafer, the actual cassettes are placed on the carrying-in cassette spaces 11a, 12a and 13a of the respective treating devices, and the empty cassettes are placed on carrying-out cassette spaces 11b, 12b and 13b. Moreover, the conveying device 20 is assumed to be on standby at a location of the carrying-out cassette space 11b of the first treating device 11. Also, the time period which is required for the conveying device to move 20 is supposed to be unchanged as before.

All the wafers stored in the actual cassette placed on the carrying-in cassette space 12a of the second treating device 12 are loaded to a treating portion 12-1, then an empty cassette carrying-out request signal is outputted from the second treating device 12 (step SB1). A control device 15 does not output an empty cassette carrying-out command signal if it receives the empty cassette carrying-out request signal. Next, the treatment in the first treating device 11 is completed and all the treated wafers are stored in the empty cassette placed on the carrying-out cassette space 11b, then a lot carrying-out request signal is outputted from the first treating device 11 (step SB2). When the above-mentioned empty cassette carrying-out request signal from the second treating device 12 and a lot carrying-out request signal from the first treating device 11 are outputted, the control device 15 outputs a lot carrying-in command signal to the conveying device 20 (step SB3).

The conveying device 20 moves to a location of the carrying-in cassette space 12a of the second treating device 12 while seizing the actual cassette placed on the carrying-out cassette space 11b of the first treating device 11, based on the lot carrying-in command signal outputted from the control device 15, during which movement is required a time period $t_1+t_2$. After the movement thereof, the conveying device 20 seizes the empty cassette placed on the carrying-in cassette space 12a of the second treating device 12, and places the actual cassette conveyed from the first treating device 11 on the carrying-in cassette space 12a. then this process is completed, the conveying device 20 is moved to a location of an empty cassette stand 14a, during which movement is required a time period $t_2$. After moving to the location of the empty cassette stand 14a, the conveying device 20 places the empty cassette on the empty cassette stand 14a. When this process is completed, the conveying device 20 is on standby until receiving the next command.

Next, in the second treating device 12, the wafer stored in the actual cassette placed on the carrying-in cassette space 12a is loaded to the treating portion 12-1, and the last wafers, which have been loaded from the actual cassette placed on the carrying-in cassette space 12a to the treating portion 12-1 and treated through all the treating portions 12-1, 12-2 and 12-3, are stored in the empty cassette placed on the carrying-out cassette space 12b. After all these wafers has been stored in the empty cassette, the lot carrying-out request signal is outputted by the second treating device 12 (step SB4). Even when the control device 15 receives the lot carrying-out request signal, it does not output the lot carrying-out command signal.

When all the wafers, which are stored in the actual cassette placed on the carrying-in cassette space 13a of the third treating device 13' are loaded in the device and then the cassette becomes empty, the empty cassette carrying-out request signal is outputted by the third treating device 13' (step SB5). When the control device 15 receives both of the above-mentioned lot carrying-out request signal outputted from the second treating device 12 and the empty cassette carrying-out request signal outputted from the third treating device 13', it outputs a lot carrying-out command signal to the conveying device 20 (step SB6). The conveying device 20 receives the lot carrying-out command signal and seizes an empty cassette 14a at a location of an empty cassette stand 14, then is moved to a location of the carrying-out cassette space 12b of the second treating device, during which movement is required a time period $t_2+t_3$.

The conveying device 20, which is moved to a location of the carrying-out cassette space 12b of the second treating device 12, seizes the actual cassette already placed thereon and places the empty cassette thereon, then is moved to a location of the carrying-in cassette space 13a of the third treating device 13', during which movement is required a time period $t_4$. The conveying device 20, which has completed movement, places the actual cassette seized by itself, on the carrying-in cassette space 13a and seizes the empty cassette placed on the carrying-in cassette space 13a. After the above-mentioned processes have been completed, the conveying device 20 is on stand-by until receiving a new command from the control device 15.

The wafer cassette conveying system according to the embodiment of the present invention is described as mentioned above. In one cycle operation, the control device 15 sends a command signal twice to the conveying device 20, where the moving time of the conveying device 20 is represented by an equation of: $(t_1+t_2)+t_2+(t_2+t_3)+t_4=t_1+3t_2+t_3+t_4$. Comparing the wafer cassette conveying system according to the embodiment of the present invention with the conventional wafer cassette conveying system, the number of instruction which are sent from the control device 15, are reduced from four times to twice, the moving time of the conveying device 20 is shorten by an amount of $(2t_1+4t_2+3t_3+2t_4)-(t_1+3t_2+t_3+t_4)=t_1+t_2+2t_3$. If $t_1=15$ [sec], $t_2=5$ [sec], $t_3=5$ [sec] and $t_4=20$ [sec], the moving time 85 [sec] in the conventional system is shorten to 55 [sec] by 30 [sec], i.e., about 35%.

Moreover, the above-mentioned conveying device 20 may be of a non-rail type, as well as such a type of running on a rail 17.

Many widely different embodiments of the invention may be constructed without departing from the spirit and scope of the invention. It should be understood that the invention is not limited to the specific embodiments described in the specification, except as defined in the appended claims.

I claim:

1. A wafer cassette conveying system comprising:

a first treating device and a second treating device each for introducing a wafer from a first wafer cassette to treat the same, placing said treated wafer in a second wafer cassette, outputting an introduction completion signal when said wafer has completed said introduction, and outputting a treatment completion signal when said wafer has completed said treatment;

a control device operatively coupled to said first and second treating devices for receiving said introduction and treatment completion signals and for outputting a conveying command signal, only when both said first treating device outputs said treatment completion signal and said second treating device outputs said introduction completion signal; and a conveying device operatively coupled to said control device for receiving said conveying command signal and for conveying said second wafer cassette from said first treating device which has outputted said treatment completion signal to said second treating device which has outputted said introduction completion signal based on said conveying command signal.

2. A wafer cassette conveying system according to claim 1, further comprising:

an empty cassette space on which an empty cassette can be placed, arranged independently to said first and second treating devices, wherein said conveying device conveys said first cassette from said second treating device to said empty cassette space based on said conveying command signal.

3. A wafer cassette conveying system comprising:

a first treating device for introducing a wafer from a first wafer cassette into said first treating device, treating said wafer and outputting said wafer into a second wafer cassette, said first treating device outputting an introduction completion signal when introduction of said wafer into said first treating device is complete, and outputting a treatment completion signal when said wafer has completed treatment in said first treating device;

a second treating device for introducing a wafer from a third wafer cassette into said second treating device to treat the same, and placing said treated wafer in another wafer cassette, said second treating device outputting an introduction completion signal when introduction of said wafer into said second treating device is complete, and outputting a treatment completion signal when said wafer has completed said treatment in said second treatment device;

a control device operatively coupled to said first and second treating devices for receiving said introduction and treatment completion signals and for outputting a conveying command signal only upon receipt of both a treatment completion signal from said first treating device and receipt of an introduction completion signal from said second treating device; and a conveying device operatively coupled to said control device for receiving said conveying command signal and for conveying said second wafer cassette from said first treating device which has outputted said treatment completion signal to said second treating device which has outputted said introduction completion signal based on said conveying command signal.

4. A wafer cassette conveying system according to claim 3, further comprising:

an empty cassette space on which an empty cassette can be placed, arranged independently to said first and second treating devices, wherein said conveying device conveys said third cassette from said second treating device to said empty cassette space based on said conveying command signal.

* * * * *